United States Patent [19]

Gendlin

[11] Patent Number: 5,717,235
[45] Date of Patent: Feb. 10, 1998

[54] NON-VOLATILE MEMORY DEVICE HAVING FERROMAGNETIC AND PIEZOELECTRIC PROPERTIES

[75] Inventor: Shimon Gendlin, Jerusalem, Israel

[73] Assignee: Kappa Numerics, Inc., New York, N.Y.

[21] Appl. No.: 797,086

[22] Filed: Feb. 10, 1997

Related U.S. Application Data

[60] Continuation of Ser. No. 486,790, Jun. 7, 1995, Pat. No. 5,602,791, which is a division of Ser. No. 384,972, Feb. 7, 1995, abandoned, which is a division of Ser. No. 889,025, May 26, 1992, Pat. No. 5,390,142.

[51] Int. Cl.$^6$ .................... H01L 27/105; G11C 11/22
[52] U.S. Cl. .................... 257/295; 257/207; 257/211; 365/145
[58] Field of Search .................... 257/295, 296, 257/310, 207, 211, 903, 904; 365/145

[56] References Cited

U.S. PATENT DOCUMENTS

| | | | |
|---|---|---|---|
| 3,579,208 | 5/1971 | Bartlett | 340/173.2 |
| 3,585,610 | 6/1971 | Bartlett | 340/173.2 |
| 3,599,185 | 8/1971 | Bartlett | 340/173.2 |
| 3,798,619 | 3/1974 | Samofalov et al. | 340/173.2 |
| 5,060,191 | 10/1991 | Nagasaki et al. | 365/145 |

*Primary Examiner*—Tom Thomas
*Assistant Examiner*—David B. Hardy
*Attorney, Agent, or Firm*—Pennie & Edmonds LLP

[57] ABSTRACT

A composition of materials having ferromagnetic, piezoelectric, and electro-optical properties is disclosed. In the preferred embodiment, the composition of materials comprises a first layer of $Pb_{(1-x-y)}Cd_xSi_y$, a second layer of $Se_{(1-z)}S_z$, and a third layer of $Fe_{(1-w)}Cr_w$, where x, y, z and w are values within the ranges of $0.09 \leq x \leq 0.11$, $0.09 \leq y \leq 0.11$, $0.09 \leq x \leq 0.11$ and $0.18 \leq w \leq 0.30$. Additionally, each of the layers contain at least one of the elements of Ag, Bi, O, and N. A random-accessible, non-volatile memory built using the invented composition of materials is also disclosed. This memory provides for storing two independent bits of binary information in a single memory cell. Each cell comprises two orthogonal address lines formed on the opposite surface of a Si substrate, a composition of materials of the present invention formed over each of the address lines, and an electrode formed over each composition of materials. The data is stored electromagnetically and retrieved as a piezoelectric voltage.

16 Claims, 16 Drawing Sheets

NON-VOLATILE MEMORY DEVICE HAVING FERROMAGNETIC AND PIEZOELECTRIC PROPERTIES

This is a continuation of application Ser. No. 08/486,790, filed Jun. 7, 1995, now U.S. Pat. No. 5,602,791 which is a division of application Ser. No. 08/384,972, filed Feb. 7, 1995 now abandoned, which is a division of application Ser. No. 07/889,025, filed May 26, 1992 and issued as U.S. Pat. No. 5,390,142.

BACKGROUND OF THE INVENTION

Computer technology requires memories having large storage capacity and high speed. Typically, in a modern computer, a semiconductor memory is employed as high-speed primary memory and magnetic disks are used for a large volume secondary memory.

Prior to the development of semiconductor memories, the high-speed primary memory was implemented using a magnetic core memory. A magnetic core memory comprises a matrix of ring-shaped ferromagnetic cores. Each memory cell of the magnetic core memory includes a ferromagnetic core having two or more wires passing through the center of the core and a sensing coil installed around the core.

When a current I is applied to a wire that passes through the core, a magnetic field is produced which has a magnetic field strength H which is a function of the current I. The magnetic field produced by the current causes a permanent magnetization of the core which is measured by the magnetic induction B. The relationship between B and H has substantial hysteresis with the result that a plot of B versus H, which is known as the magnetization curve or BH loop, is substantially square, The magnetic induction B in the core has two states, $B_r$ and $-B_r$, that correspond to the opposite directions of the magnetic field. Accordingly, each core can store a bit of binary data by associating one state with a "1" and the other state with a "0". Illustratively, $+B_r$ may be associated with a binary "1" and $-B_r$ with a binary "0".

The binary data is written into a core memory cell by applying appropriate currents to the wires. If the total current passing through the core is greater than a critical current $I_c$, the magnetic induction of the core changes from $-B_r$ to $+B_r$. Similarly, if the current is less than $-I_c$, the magnetic induction switches from $+B_r$ to $-B_r$. Advantageously, in an array of magnetic cores, switching is performed as the result of the coincidence of signals on two or more wires. Thus, if the magnetic induction initially has the value of $-B_r$ corresponding to a "0", a binary "1" is stored by applying a current $I>I_c/2$ to each of the two wires, so that the total current passing through the core is greater than $+I_c$ which causes the magnetic induction to change to $+B_r$.

The data stored in the core is retrieved by sensing the voltage across the coil induced by switching between the two magnetic states described above. The polarity of the induced voltage indicates the magnetic state of the core prior to switching.

Although the magnetic core memory described above is random accessible and non-volatile, such memory is large, consumes a large amount of power, operates at a slow speed and can not be manufactured to have a high storage density. To overcome these problems, magnetic thin film memory devices have been developed. A magnetic thin film memory consists of a strip of ferromagnetic thin film, two or more wires for writing data formed on the film and a coil around the film for reading data.

In the thin film memory, the magnetic moment M of the film represents the stored information. The magnetic moment M is oriented primarily in the plane of the film, and has two discrete orientations or states M and -M that represent binary "1" and "0". To store a bit of binary data, currents are applied to the wires formed on the thin film these currents induces a magnetic field that is sufficient for changing the direction of the magnetic moment M. The stored information is retrieved by applying currents to the wires and measuring the induced voltage in the coil. As in magnetic core memory, the currents are typically selected such that a single current has insufficient amplitude to reverse the magnetic moment of the film so that at least two coincident currents are require for storing data.

There are significant drawbacks associated with magnetic thin film memory technology. First, thin film devices have an open magnetic flux structure and therefore the BH loop is smeared by a self-demagnetizing effect. To reduce this effect, the film is typically fabricated as a rectangle whose length is much greater than its width. Since the induced voltage in the coil around the film is proportional to the cross-sectional area of the film, reducing the width of the film also reduces the induced voltage. As a result, the readout signal is easily affected by noise.

Second, in existing magnetic films, the magnetic moment has a preferred in-plane direction. Thus the device is complicated by the necessity of applying currents of different amplitude for storing and retrieving data in the selected orientations. In addition, the thin film devices are not sufficiently small to achieve high densities.

In comparison to magnetic core and thin film memories semiconductor memory is faster, consumes less power, and can have higher storage densities. Typical semiconductor memories include Dynamic Random Access Memory (DRAM), Static Random Access Memory (SRAM), and Read Only Memory (ROM).

DRAM offers relatively high speed, high density, low power consumption, and is readable and writable. However, both DRAM and SRAM are volatile, that is, they lose the stored information when the power is turned off. In addition, DRAM requires a constant refresh of the stored data which necessitates complex circuitry. While SRAM does not require a refresh, it has high power consumption and does not have high storage density.

ROM's are non-volatile but the information stored in a ROM cannot be updated, i.e., data cannot be easily written into a ROM, In a typical disk storage system, ferromagnetic material having a substantially square BH loop is coated on the disk; and a magnetic head reads and writes information on the disk as it rotates past the head. The disk is divided into circular tracks. Each track is further divided into small regions in which a magnetic moment has two states that represent binary values. An external magnetic field introduced by the read/write head changes the magnetic moment of each small region so as to store a binary value in the region. Thus, to write data, the magnetic head magnetizes an adjacent small region of the rotating disk material. Stored data is retrieved in the form of a voltage induced in the head by the magnetic moment of the small region as it moves past the head.

Magnetic disk storage systems can store high volumes of data, e.g., 500 Megabytes or more. The magnetic disk storage systems, however, are not random accessible, operate at slow speed due to the requirement of mechanical movement, and require complex mechanical and electronic assemblies.

As will be apparent, none of the above-described memory technologies provides all the features that are desirable in a memory storage system. Thus, there is a present need to develop a non-volatile, high speed, high capacity, random accessible, static, and updatable storage system.

SUMMARY OF THE INVENTION

The present invention relates to a new composition of materials which has ferromagnetic, piezoelectric and electro-optical properties and can be employed as a storage media. This invention also relates to a non-volatile random accessible memory built on the basis of the invented composition of materials. A novel method for storing and retrieving two independent bits of information in a single memory cell of the present invention is also disclosed.

The preferred composition of materials of the present invention comprises layers of $Pb_{(1-x-y)}Cd_xSi_y$, $Se_{(1-z)}S_z$, and $Fe_{(1-w)}Cr_w$ where x, y, z and w indicate the proportions of the elements within their respective layers. These values are preferably within the following ranges: $0.09 \leq x \leq 0.11$, $0.09 \leq y \leq 0.11$, $0.09 \leq z \leq 0.11$, and $0.22 \leq w \leq 0.36$. In the preferred embodiment, the layers of the composition of materials also contain the following elements: Bi, Ag, O and N. These elements are introduced by electrolysis in a solution containing $Bi_2O_3$ and $AgNO_3$.

In a memory device of the present invention, two sets of parallel address lines are disposed orthogonally on the opposite sides of a planar substrate. The layers of the novel composition of materials, as described above, are disposed on both sides of the substrate above the address lines with the FeCr layers outermost, and an electrode is connected to the outermost FeCr layer on each side of the substrate. An individual memory cell is located at each crossing point of the address lines of the two sets.

By applying appropriate current pulses to the two address lines, two independent bits of information can be magnetically stored in a single memory cell. This information is retrieved as a piezoelectric voltage between the electrodes that is generated in response to appropriate current pulses applied to the two address lines.

More specifically, to store and retrieve a first bit of information in a memory cell, two synchronized current pulses having the same amplitude and polarity are applied to two orthogonal address lines. The second bit is stored and retrieved in that memory cell by applying two synchronized pulses of the same amplitude but opposite polarity to the same two address lines. The current pulses employed for storing binary information are such that the amplitude of a single pulse is not sufficient to alter the state of the stored information but that two concurrent pulses are sufficient for storing data. The current pulses employed for retrieving the stored binary information have amplitudes insufficient to alter the stored information.

Such a memory cell is non-volatile, random accessible, static, operates at high speed, requires low power, is readable and writable, and can be made in high density arrays.

BRIEF DESCRIPTION

These and other objects, features and advantages of the invention are fully set forth in the accompanying Detailed Description in which.

Figure 5A:
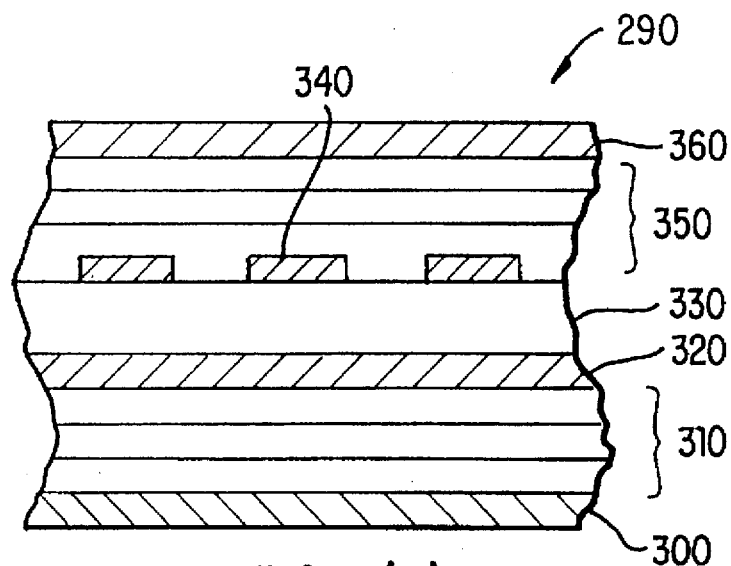
Figure 6A:
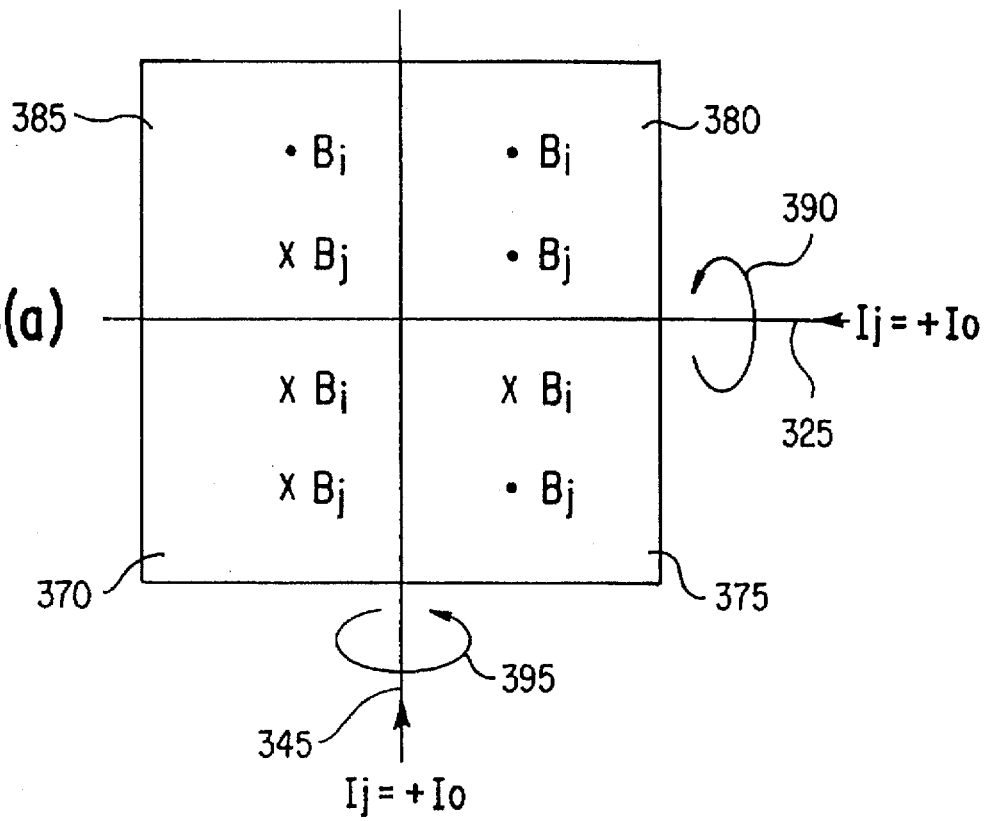
Figure 7A:
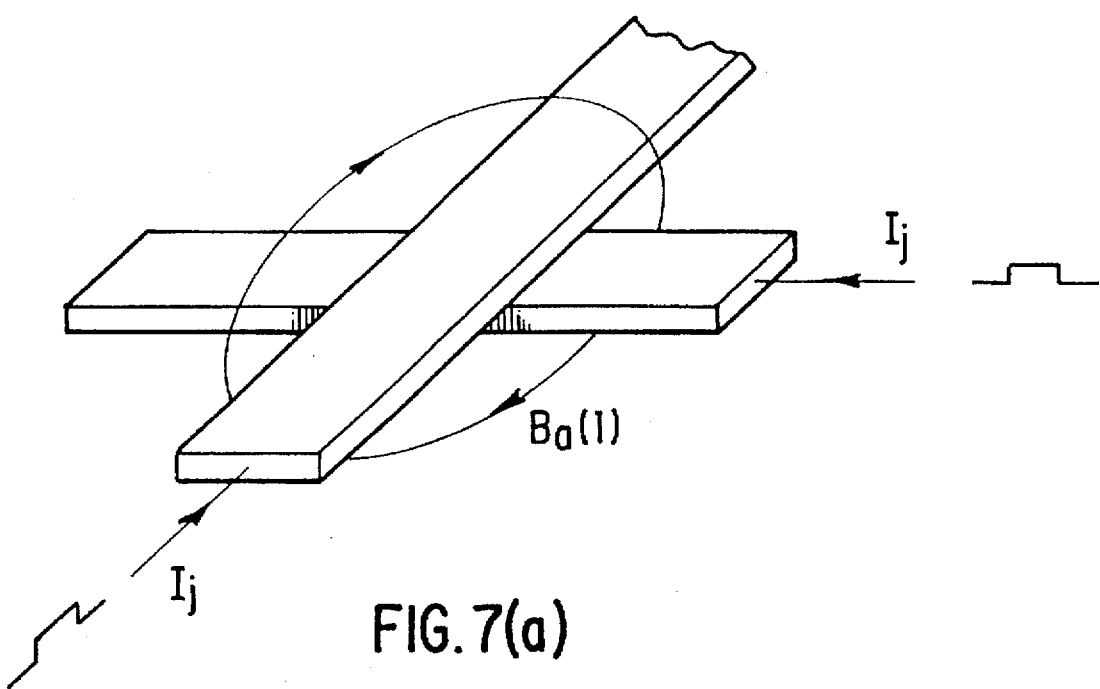
Figure 8A:
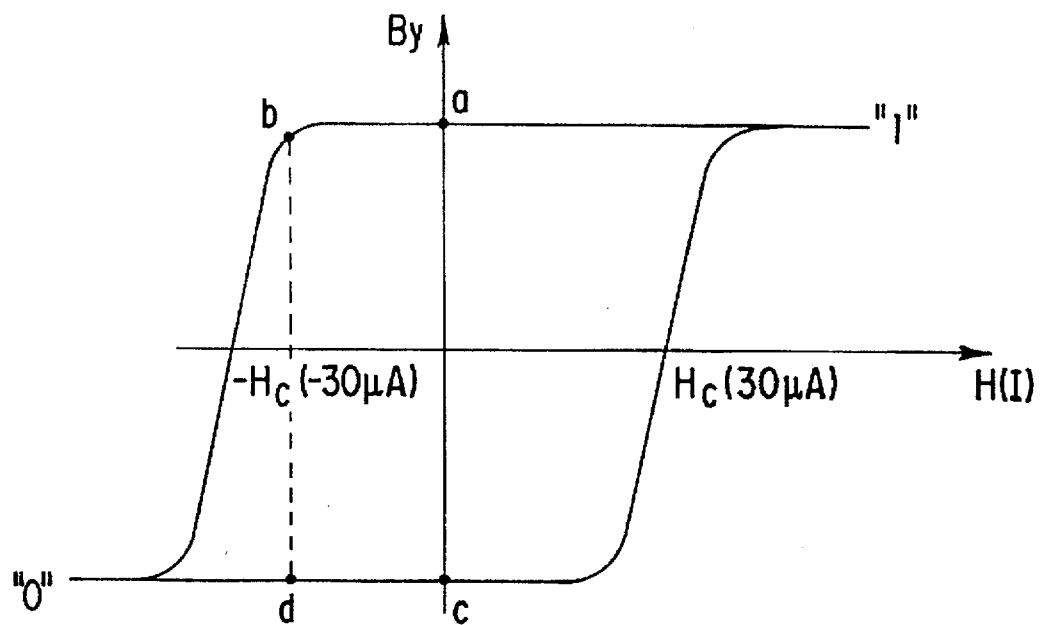
Figure 9A:
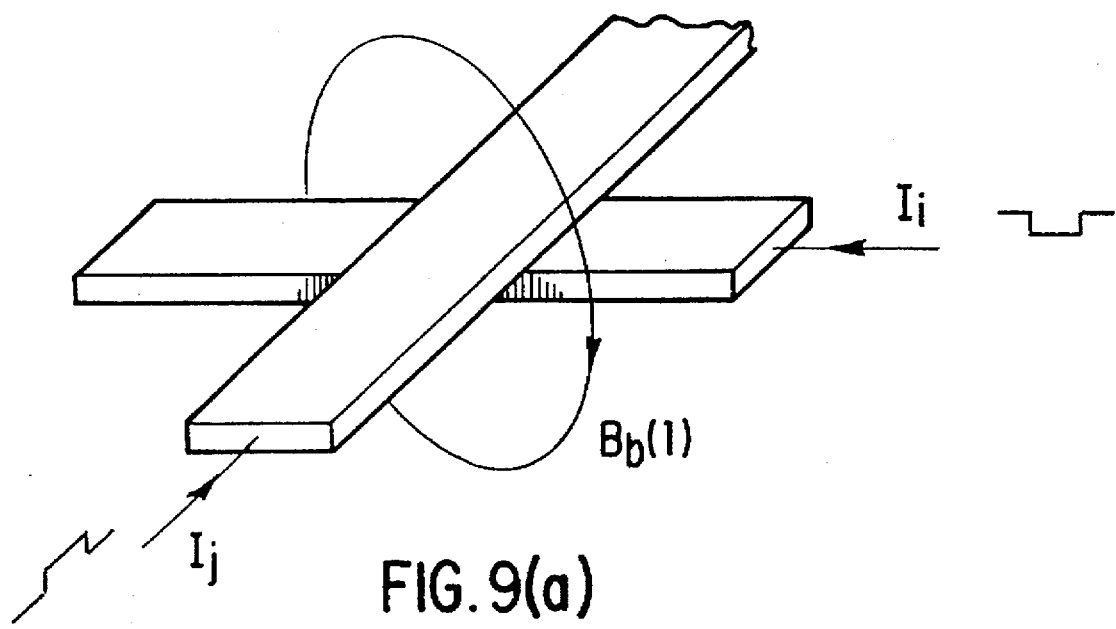
Figure 9B:
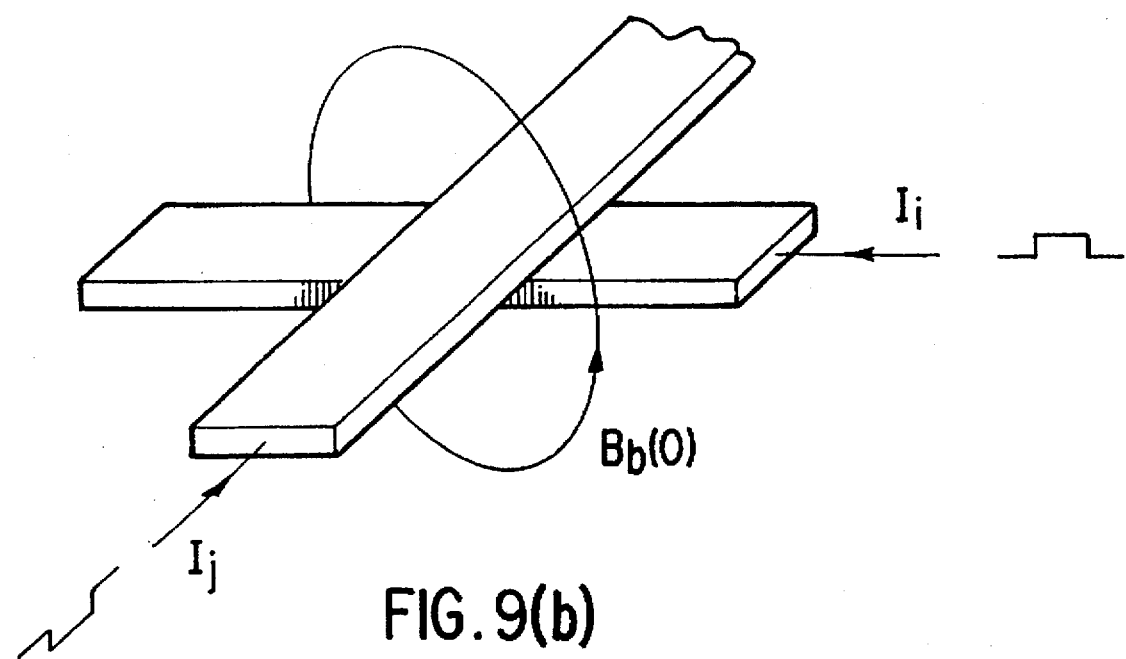
Figure 10:
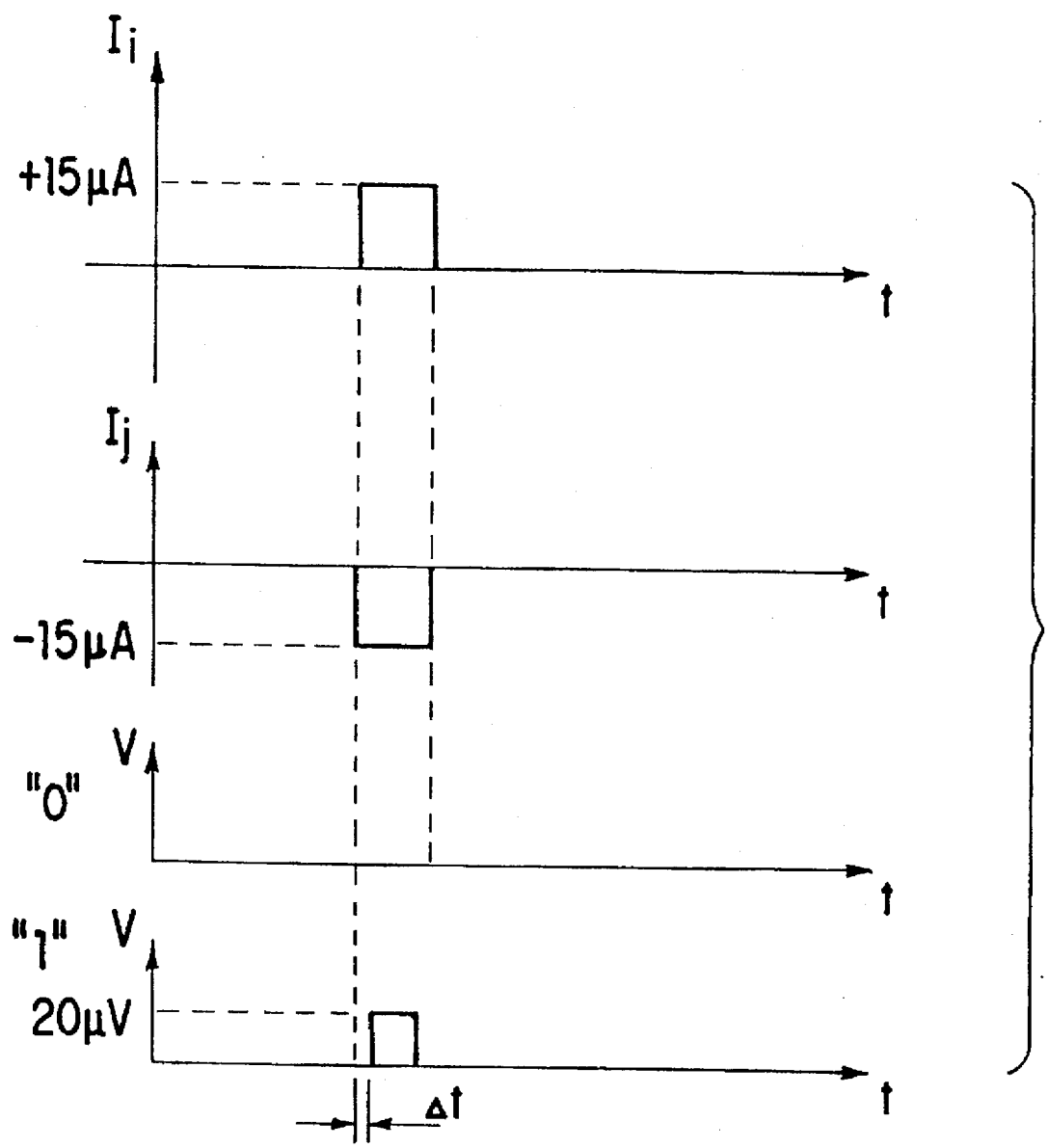
Figure 11:
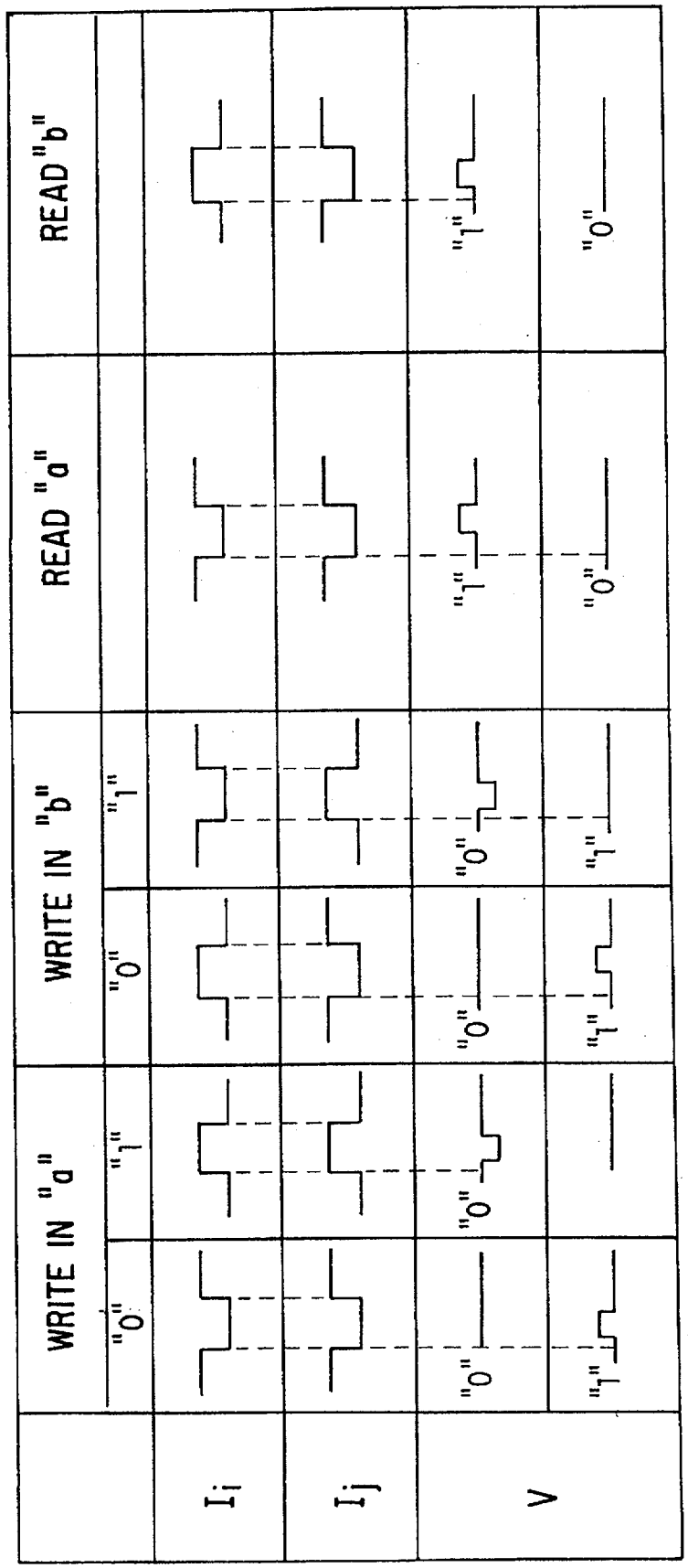
Figure 12A:
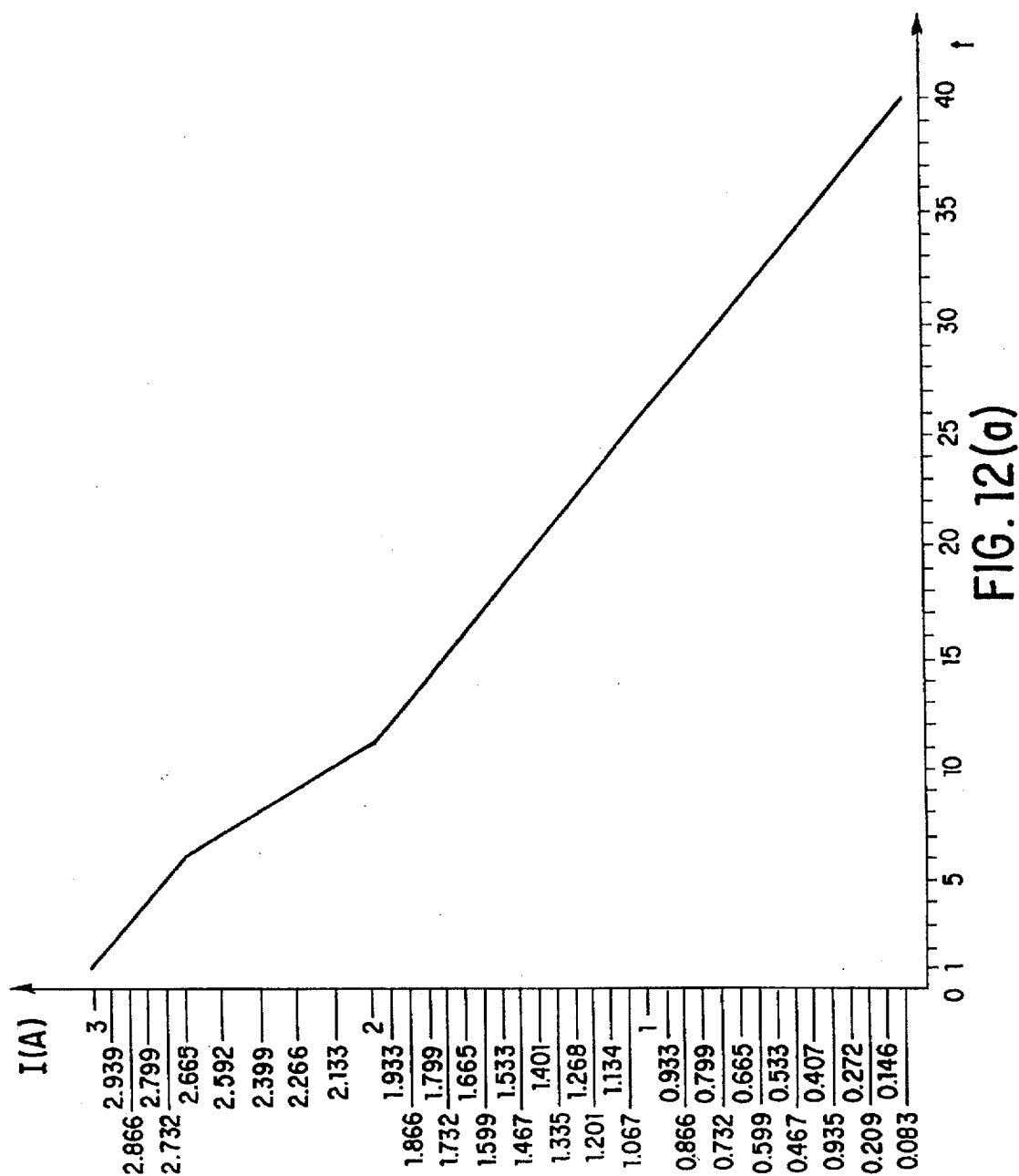

FIGS. 4(a)–(j) illustrate the process of generating piezoelectric voltage within the composition of materials;

FIGS. 5(a) and (b) are the cross section and top-view of the preferred embodiment of the memory device of the invention;

FIGS. 6(a) and (b) illustrate the process of selecting carriers within the memory device;

FIGS. 7(a) and (b) illustrate storing the first bit of information into the memory device;

FIGS. 8(a) and (b) show the process of reading the stored first bit of information;

FIGS. 9(a) and (b) illustrate storing a second bit of information into the memory device;

FIG. 10 shows the current pulses used for retrieving the second bit of information stored in the memory device and corresponding output;

FIG. 11 is a summary list of preferred methods for storing and retrieving information from the memory device; and FIGS. 12(a) and (b) show the electrical current with respect to process time in an electrolysis, process utilized as a step in fabricating the composition of materials.

DETAILED DESCRIPTION

The present invention relates to a composition of materials having ferromagnetic, electro-optic and piezoelectric properties. A random accessible non-volatile memory device utilizing the invented composition of materials is also disclosed. Advantageously, the memory device is capable of storing two independent bits of information.

The preferred composition of materials comprises layers of $Pb_{(1-x-y)}Cd_xSi_y$, $Se_{(1-z)}S_z$, and $Fe_{(1-w)}Cr_w$. The values of x, y, z and w are preferably in the ranges of $0.09 \leq x \leq 0.11$, $0.09 \leq y \leq 0.11$, $0.09 \leq z \leq 0.11$, and $0.22 \leq w \leq 0.26$. Preferably, each layer also includes one or more of the elements Bi, Ag, O and N.

Alternatively, in the $Pb_{(1-x-y)}Cd_xSi_y$ layer, Ge can be employed in place of Si and/or Zn or Te can be employed in place of Pb. Also, other conductive elements such as Au, Pt, or Cu can be added to the layer structure in place of Ag. The invention may also be practiced using concentrations of Cr in the $Fe_{(1-w)}Cr_w$ layer such that w ranges from 0.18 to 0.30.

Figure 1:
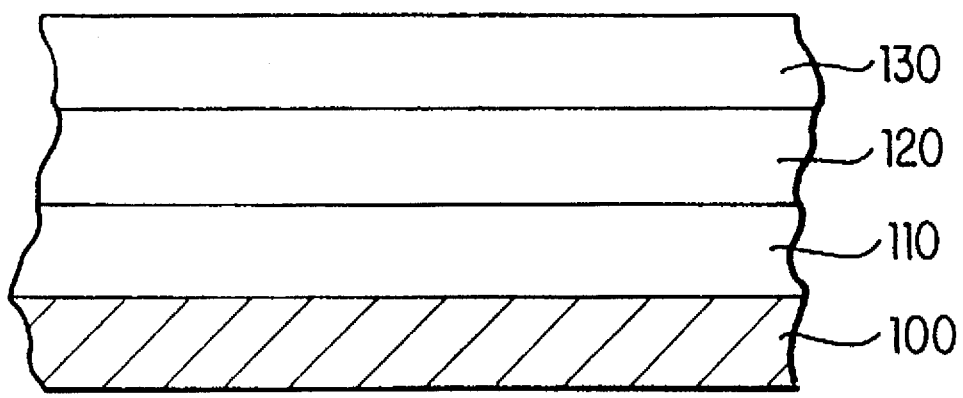
FIG. 1 shows the cross-section of a preferred embodiment of the composition of materials of the present invention.

More specifically, as shown in FIG. 1, a preferred embodiment of the invented composition of materials comprises a $Pb_{0.80}Cd_{0.10}Si_{0.10}$ layer 110, a $Se_{0.90}S_{0.10}$ layer 120, and a $Fe_{0.76}Cr_{0.24}$ layer 130. The $Fe_{0.76}Cr_{0.24}$ layer is mainly responsible for the ferromagnetic properties of the composition of materials, and the $Pd_{0.80}Cd_{0.10}Si_{0.10}$ and $Se_{0.9}S_{0.1}$ layers are mainly responsible for its electro-optical properties. All three layers exhibit piezoelectric properties.

In the devices describe below, these layers are sequentially formed an a substrate 100 and each of the $Pb_{0.80}Cd_{0.10}Si_{0.10}$, $Se_{0.90}S_{0.10}$ and $Fe_{0.76}Cr_{0.24}$ layers is 0.5 μm thick.

Physical properties of the invented composition of materials are described below. Understanding of these properties will help to understand the operation of the memory device employing this composition of materials.

By way of background, a ferromagnetic material exhibits a permanent magnetic field in the absence of an external magnetic field. Such materials can be described in terms of a large number of small magnets known as magnetic dipoles. An external magnetic field applied to a ferromagnetic material aligns the magnetic dipoles within the material in the direction of the applied field, so that the total magnetic field within the material is the sum of the external field and the field generated by the aligned magnetic dipoles. When the influence of an external magnetic field is discontinued, the orientation of magnetic dipoles does not change, resulting in a constant magnetic field in the material. Magnetic information storage is based on this property of ferromagnetic materials.

Figure 2:
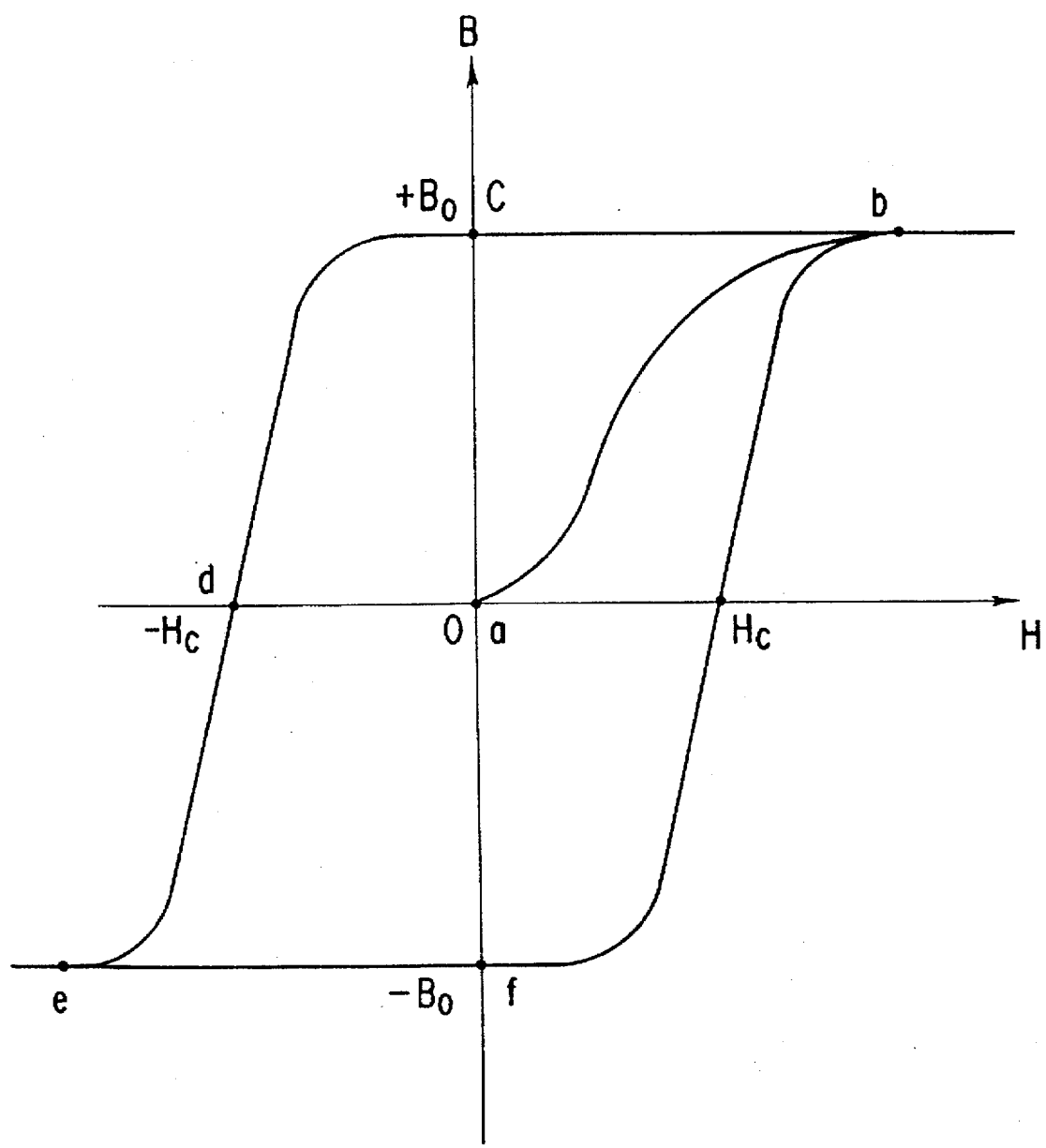
FIG. 2 illustrates the magnetization curve (BH loop) of a conventional ferromagnetic material.

FIG. 2 shows an exemplary magnetization curve of a typical ferromagnetic material. The magnetization curve is also referred to as a BH loop. The y axis in this figure represents magnetic induction B, which is the overall magnetic field in the material, and the x axis represents the magnetic field strength H of the external magnetic field. Thus, the BH loop shows the change in the magnetic induction B with changing magnetic field strength H.

Let us consider the BH loop of FIG. 2 in further detail. Assuming that initially the orientations of magnetic dipoles of the ferromagnetic material are evenly distributed in all directions, the total value of B in the absence of the external field is zero (point "a" on the curve). When an external magnetic field is applied to the ferromagnetic material, the value of B gradually increases as H increases until it reaches a point where magnetic induction B begins to saturate (point "b" on the curve). In other words, when H reaches a certain value, B remains substantially at $B_0$ even if H is being increased. If, after saturation, the external magnetic field is decreased to H=0, magnetic field induction B does not return to the point "a" (B=0). Instead, the value of B remains approximately at $B=B_0$ (point "c" on the curve).

At point "c" the direction of the external magnetic field H is reversed. At approximately $H=-H_c$, the external field changes the polarity of the field B, and, at point "e", the field saturates at the opposite polarity $B=-B_0$.

Increasing the field strength H causes B to change from point "e" on the curve to point "b", as illustrated in FIG. 2.

Figure 3:
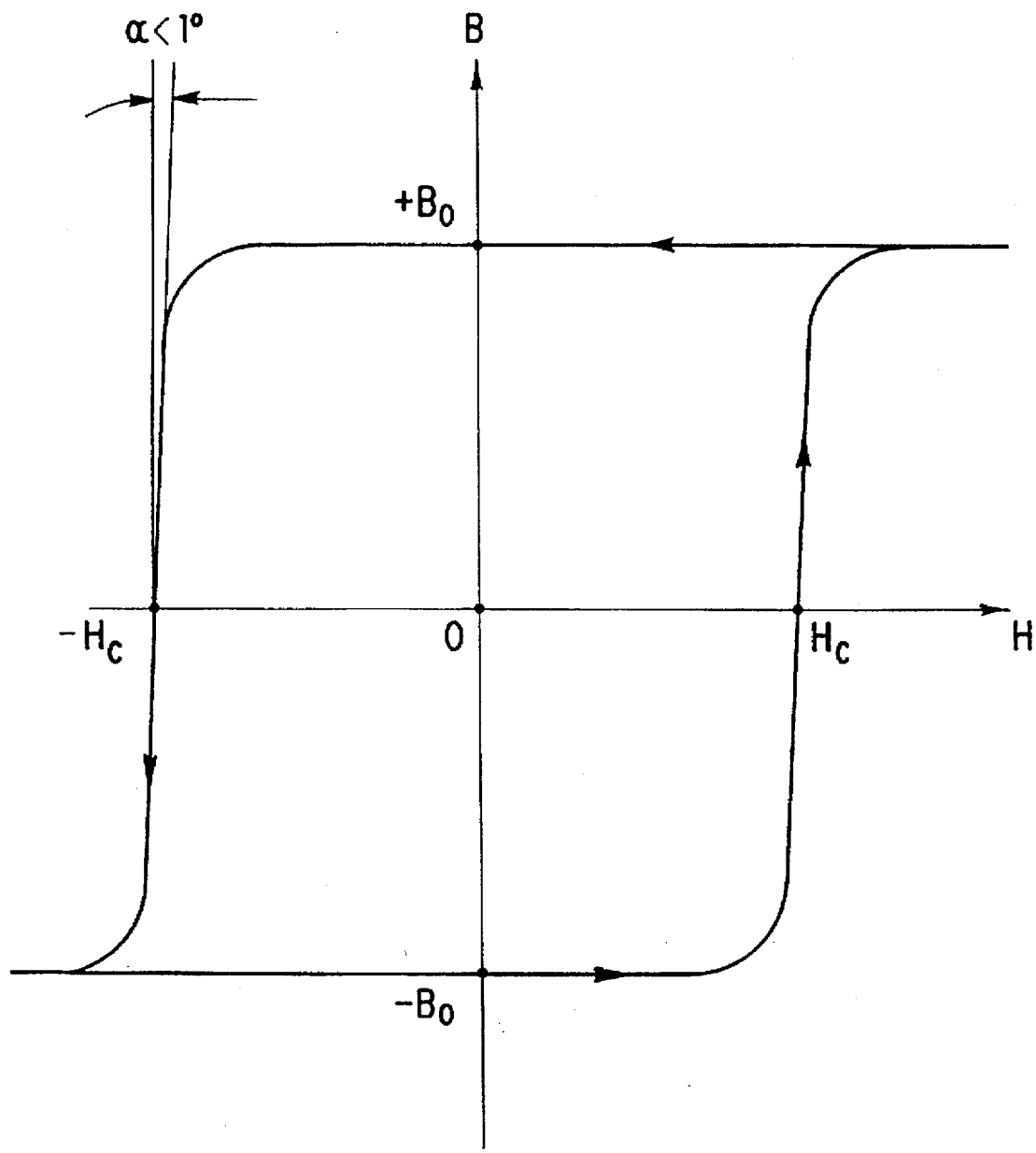
FIG. 3 shows a substantially square BH loop of the composition of materials of the present invention.

FIG. 3 illustrates the BH loop of the composition of materials of the present invention. As in FIG. 2, the x-axis indicates the external field strength H and the y axis indicates the magnetic induction B. It is important to note that for the invented composition of the materials, the shape of the BH loop is substantially square with the angle α between the y-axis and the BH loop at B=0 being less than 1°. Because the magnetization curve is substantially square, the magnetic induction B is almost invariably at one of two discrete, stable states, $+B_0$ and $-B_0$. Accordingly, the novel composition of materials is suitable for storing binary information.

The composition of materials of the present invention also has piezoelectric properties. In general, if the mechanical pressure on a piezoelectric material is reduced, a piezoelectric voltage is generated. In the present invention, if the mechanical pressure on the composition of materials is reduced in a direction substantially perpendicular to the plane of the layers within the composition of materials, a piezoelectric voltage is generated across the layers. In the present invention, the change in mechanical pressure is produced by a change in the magnetic states of the composition of materials.

Figure 4A:
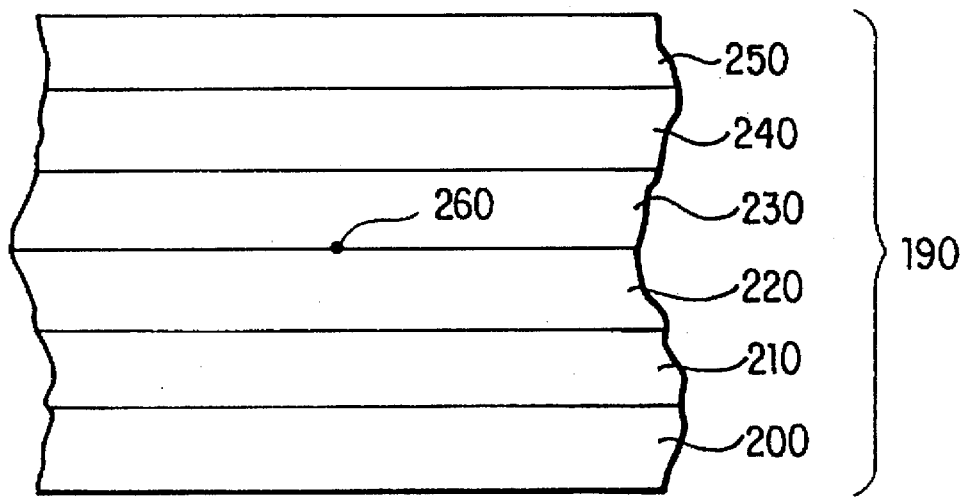

An illustrative structure exhibiting the piezoelectric properties of the present invention is shown in FIG. 4(a). An explanation of its operation is set forth in conjunction with FIGS. 4(b)–(j).

FIG. 4(a) illustrates a structure 190 comprising two layers of the composition of materials of the present invention. Specifically, the structure comprises a first FeCr layer 200, a first SeS layer 210, a first PbCdSi layer 220, a second PbCdSi layer 230, a second SeS layer 240, and a second FeCr layer 250. In addition a wire 260 passes through the middle of the structure, parallel to the layers.

Figure 4B:
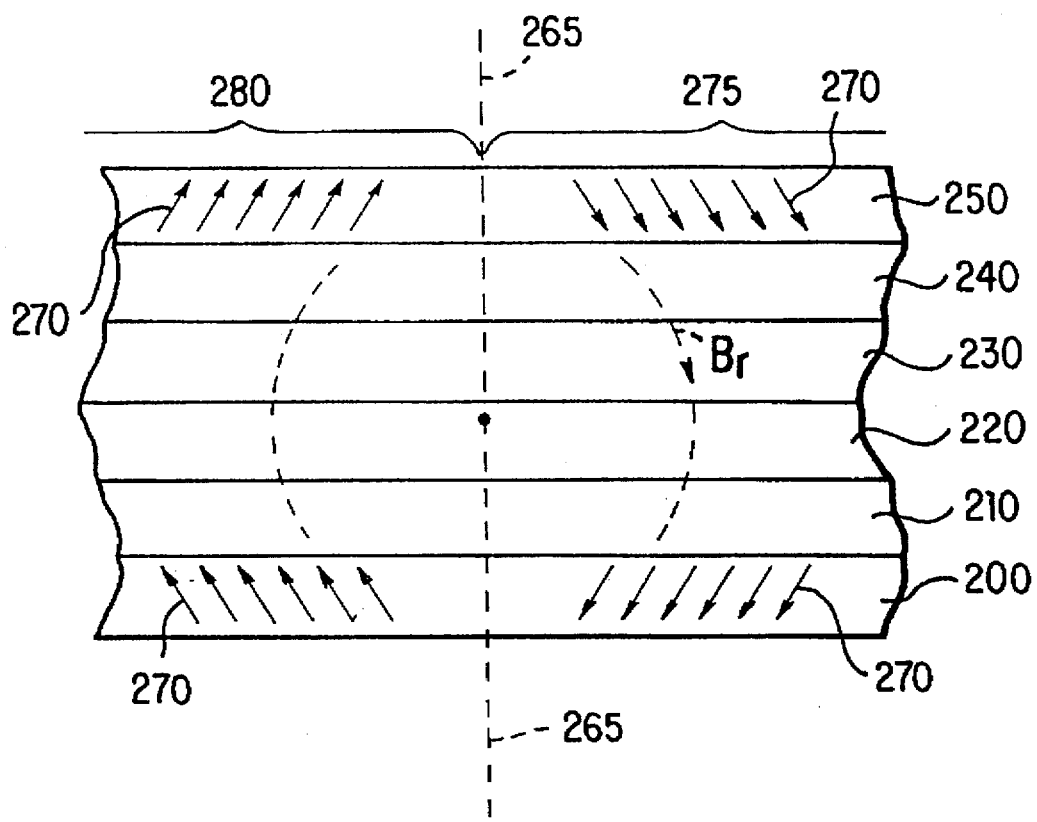

As shown in FIG. 4(b), an electrical current applied to the wire 260 in a direction that is into the page generates a substantially circular magnetic field around the wire, as indicated by a circle $B_r$ in the clockwise direction indicated by the arrow. Arrows 270 illustrate the directions of the magnetic dipoles in FeCr layers 200, 250 under the influence of this external field. If we divide the structure into two sections 275, 280 that are symmetric about a vertical axis 265 perpendicular to wire 260 as shown in FIG. 4(b), the dipole arrangement in sections 275, 280 is equivalent to two magnets of the same strength having north and south poles as indicated by arrows 282 and 284 in FIG. 4(c). The length of each arrow represents the amplitude of the magnetic induction B of the corresponding magnet. Due to the attraction between the South pole S and the North pole N of each magnet, the storage media is mechanically compressed in the direction perpendicular to the layers of the structure.

Figure 4D:
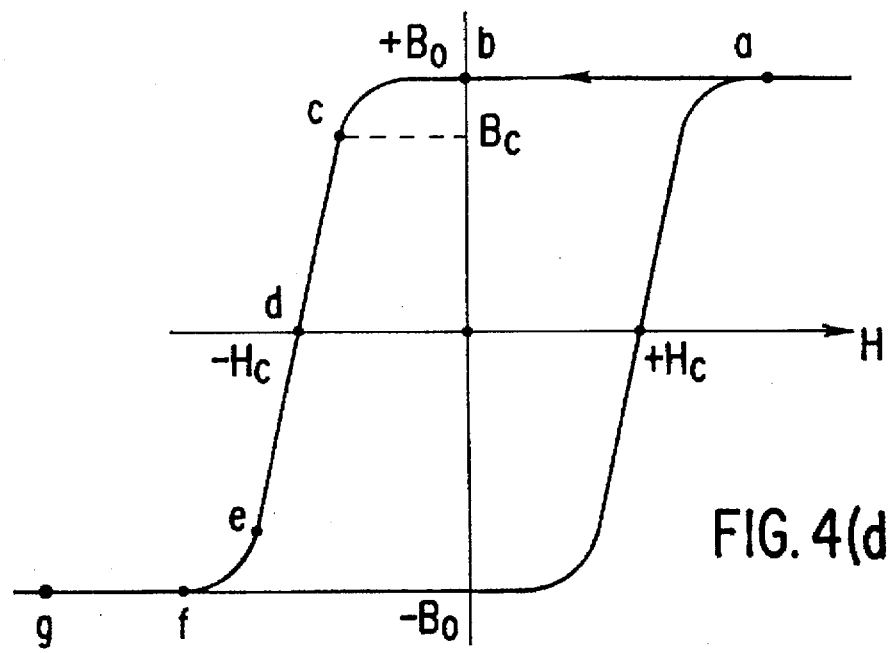
Figure 4C:
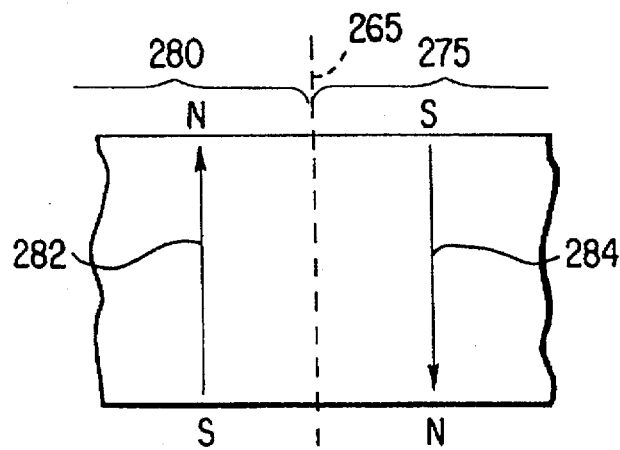

The BH loop of the magnetic induction $B_r$ is shown in FIG. 4(d). As described previously the BH loop is substantially square, exhibiting two discrete, stable magnetic states, $+B_0$ and $-B_0$.

Additionally, the magnetic field has a critical field strength $H_c$ which is defined as the amplitude of the magnetic field strength which causes switching between $+B_0$ and $-B_0$. Consequently, if H is greater than $H_c$, the magnetic induction $B_r$ will have a value $+B_0$. If H is less than $-H_c$, $B_r$ will have a value $-B_0$.

Assume that initially under the influence of the applied external field, the magnetic state is described by point "a" on the curve of FIG. 4(d), where the induction is $+B_0$. To change the magnetic state of the storage media from $+B_0$ to $-B_0$, the current through wire 260 must be reduced to reduce the magnetic field strength H. When the current is zero the magnetic strength H is also zero (point "b" on the BH loop). As noted, due to its ferromagnetic properties, even without the external field, the magnetic state of the storage media remains at $B_0$, i.e., the information represented by the magnetic induction B is retained.

Figure 4E:
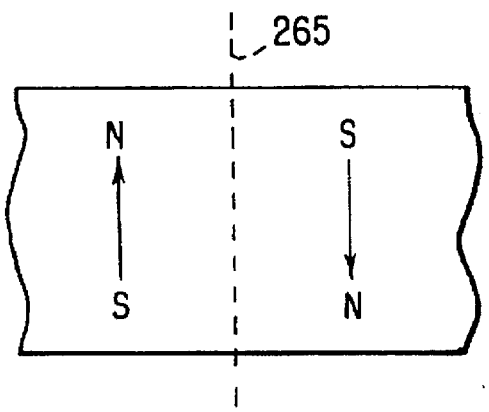

When the direction of the current is reversed, the magnetic field strength continues to decrease point. At "c", the magnetic induction B reaches the value $B_c$, which is less than $B_0$. At this point, the dipole moment has been reduced, as shown in FIG. 4(e), because the dipoles begin to realign in the opposite direction. Accordingly, the mechanical pressure on the layers due to the attraction of the FeCr layers 200, 250 has been reduced. The change in the pressure on the layers causes piezoelectric voltage to be generated perpendicularly across the layers At point "d", where $H=-H_c$ and the magnetic induction B is zero, the pressure applied to the layers is minimal because the dipoles are aligned in different directions. At this point, the induced piezoelectric voltage reaches its maximum value, due to the maximum change in the pressure on the layers.

Figure 4F:
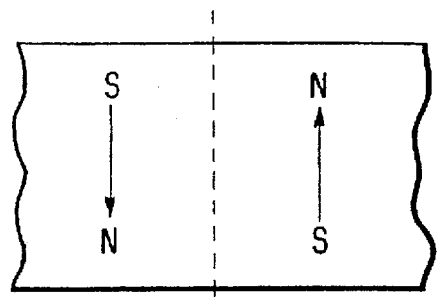

As H continues to decrease below $-H_c$, the magnetic state switches from point "d" to the point "e" and then to point "f" where it reaches the second stable state $B=-B_0$. FIG. 4(f) shows that at point "f" the poles of the magnets have been reversed. Thus, at point "f", the mechanical pressure on the layer returns to its initial value, diminishing the piezoelectric voltage. Increasing the reversed current further (from point "f" to point "g") would not increase the magnitude of the dipole moment and therefore would not increase mechanical pressure on the layers.

Figure 4G:
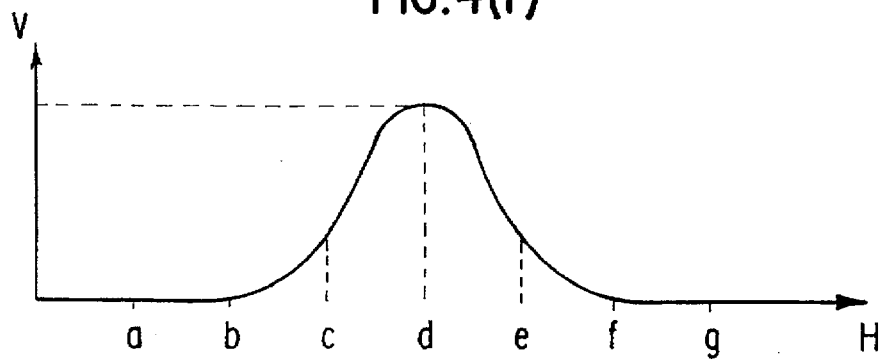
Figure 4H:
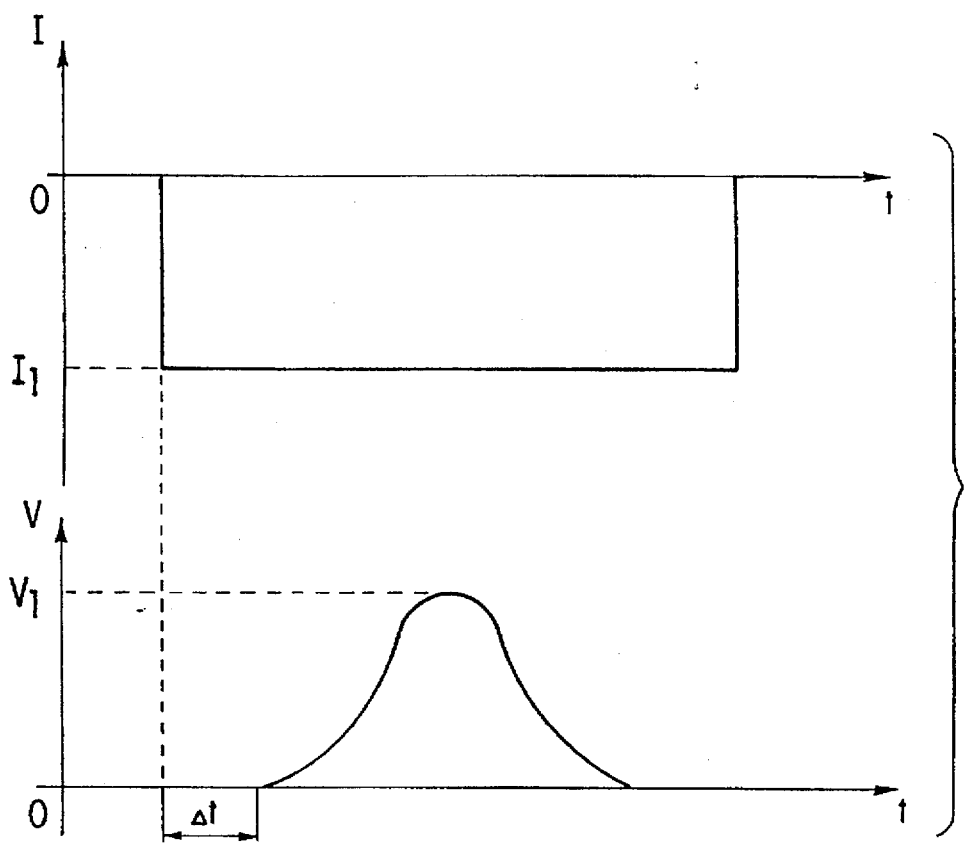

FIG. 4(g) illustrates the piezoelectric voltage that corresponds to various points on the BH loop of FIG. 4(d) as $B_0$ changes to $-B_0$. In FIG. 4(h), the piezoelectric voltage generated in response to a current pulse is illustrated in the time domain. The piezoelectric voltage is a piezoelectric voltage pulse that is delayed from the time of the application of the current pulse. The current pulse applied to the wire has an amplitude $-I$ that is sufficient to switch $B_0$ to $-B_0$.

Similarly, switching from the magnetic state $-B_0$ to $+B_0$ generates a negative piezoelectric voltage pulse.

Figure 4I:
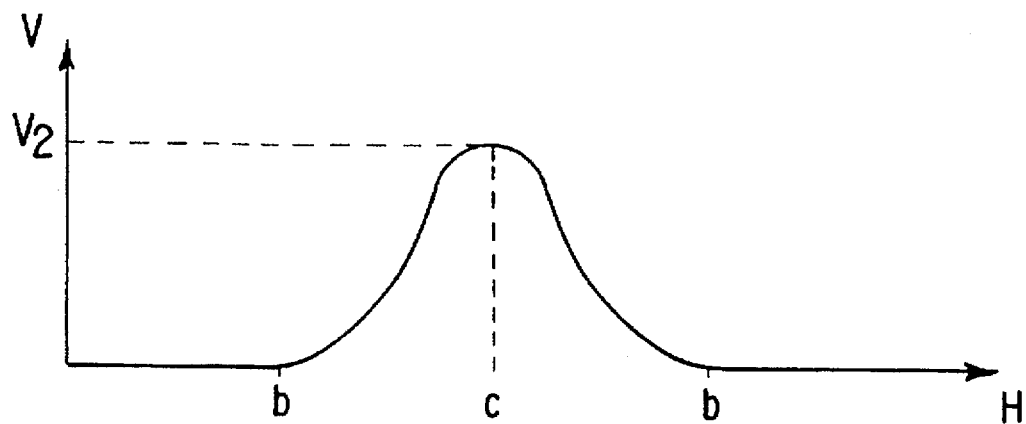

As indicated FIG. 4(d), a current that generates a field having an amplitude greater than $H_c$ is required for switching between the magnetic states. If, however, a current is applied having a lesser amplitude which causes B to assume a value indicated by point "c" in FIG. 4(e), the magnetic state is unstable. In such case, the magnetic induction B tends to oscillate between the values of $B_0$ (point "b") and $B_c$ (point "c") A piezoelectric voltage pulse generated in response to such oscillation is shown in FIG. 4(i). The amplitude $V_2$ of this piezoelectric voltage pulse is smaller than the amplitude of the pulse generated as a result of switching from $+B_0$ to $-B_0$ (FIG. 4(g)).

Figure 4J:
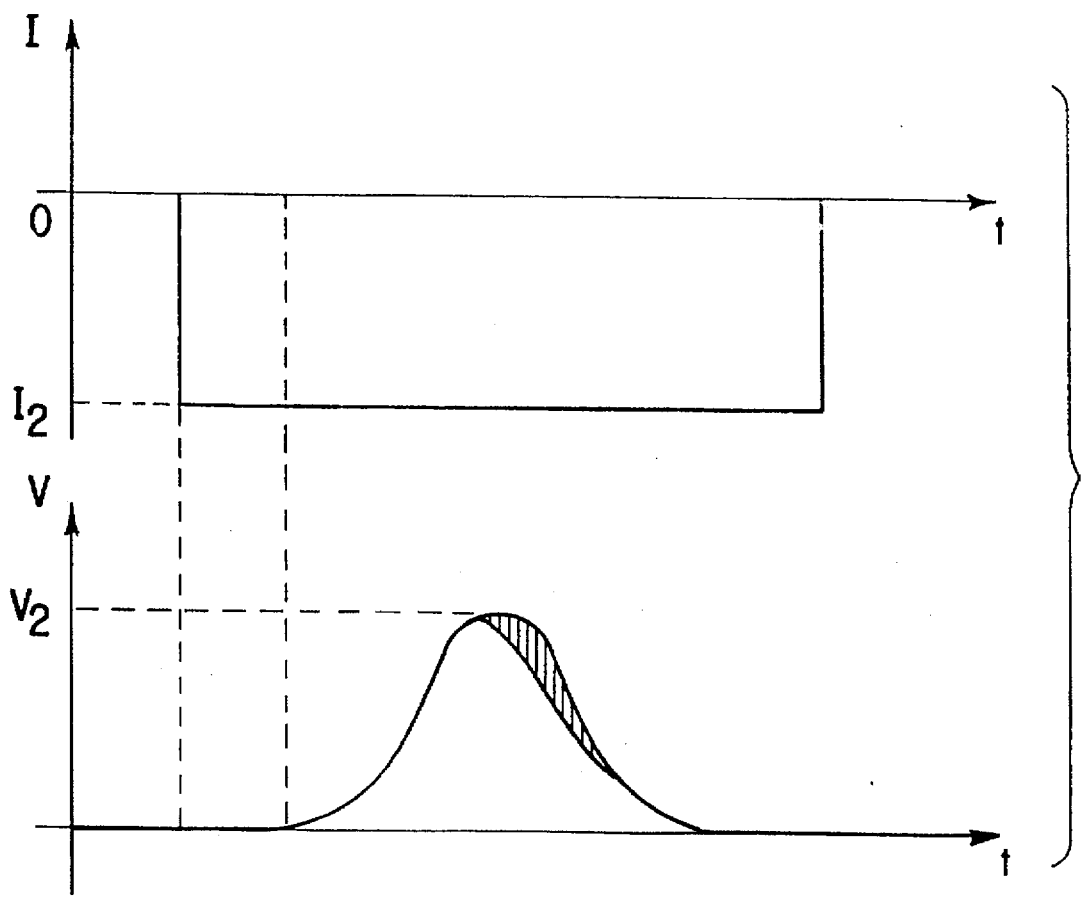

FIG. 4(j) shows a current pulse I which causes B to assume the value $B_c$. The piezoelectric voltage pulse, generated in response to this current is shown in the lower portion of the figure. The shaded area reflects the oscillation between the two states ($B_c$ and $+B_0$), as it would be observed on an oscilloscope. As described subsequently, the piezoelectric voltage generated in response to the current that disturbs but does not switch the magnetic states, can be employed for reading magnetically stored information.

FIGS. 5(a) and (b) illustrate the cross-section (not to scale) and the top-view of a preferred embodiment of a portion of a memory device 290 of the present invention. The memory device comprises a silicon planar substrate 330, first address lines 320 formed on one surface of the substrate, and second address lines 340 orthogonal to the first lines; formed on the opposite surface of the substrate. A first set 310 and a second set 350 of the layers of materials of the present invention are disposed on opposite sides of the substrate over the address lines. Electrodes 300, 360 are connected to the layers 310, 350 respectively of the composition of materials.

The first and second address lines are silver strips approximately 2 μm wide and approximately 1 μm thick. Illustratively the spacing between adjacent address lines is approximately between 9 to 20 μm, depending on the desired density of the memory device. For example in one embodiment the spacing is 9.5 μm and in a different embodiment the spacing is 19 μm. Each set of layers of materials 310, 350 comprise a $Pb_{0.80}Cd_{0.10}Si_{0.1}$ layer, a $Se_{0.90}S_{0.10}$ layer, and a $Fe_{0.76}Cr_{0.24}$ layer sequentially formed on one of the address lines 320, 340 on the Si substrate with the two FeCr layers being outermost. Also each of the layers is preferably 0.5 μm thick so that each set is preferably 1.5 μm. Each layer is homogeneously saturated with Bi, Ag, O, and N. Preferably the substrate is 40 μm thick and the electrodes are 1 μm thick silver layers.

The fabrication of this device begins with depositing 1 μm thick metal (preferably silver) layers onto the opposite surfaces of a 40 μm thick silicon planar substrate. Alternatively, substrates made of other materials such as $BaF_2$ could be used in place of the Si substrate. The deposition is conducted by a conventional technique such as thermal evaporation, e-beam evaporation, or sputtering. The deposited silver layers are then photolithographically patterned and etched to form a series of metal strips, each having a width of approximately 2 μm. The series of strips on one side of the Si substrate is orthogonal to the strips on the opposite side. The strips on both sides of the substrate form a cross-barred structure.

The layers of $Pb_{0.80}Cd_{0.10}Si_{0.10}$, $Se_{0.90}S_{0.10}$, and $Fe_{0.76}Cr_{0.24}$ are then deposited sequentially. Prior to the deposition, components of the layers are prepared by mixing together proper amounts of powder of each required element. The amount of powder of each element corresponds to the desired proportion of the element in the corresponding layer. For example, for the deposition of the $Pb_{0.80}Cd_{0.10}Si_{0.10}$, layer the powders of Pb, Cd and Si are mixed in the proportions 80:10:10. After the powders of Pb, Cd, and Si are well mixed, the mixture is pressed and baked to form a suitable source of materials for the selected deposition technique. The source materials for deposit of the $Se_{0.90}S_{0.10}$ and $Fe_{0.76}Cr_{0.24}$ layers are prepared in a similar fashion.

The layers of $Pb_{0.80}Cd_{0.10}Si_{0.10}$, $Se_{0.9}S_{0.1}$ and $Fe_{0.76}Cr_{0.24}$ are then sequentially deposited onto both sides of the substrate. The deposition can be accomplished using well-known methods. For example in the preferred embodiment a plasma sputtering techniques is utilized for creating the layered structure. After each layer is deposited by sputtering the temperature of the layer is raised rapidly (i.e. in about 1.5 seconds) to approximately 500° C. and then cooled to approximately a room temperature for the deposition of the next layer. As conventionally done, the spattering is performed in vacuum utilizing Ar gas. As indicated, each of the $Pb_{0.80}Cd_{0.10}Si_{0.10}$, $Se_{0.90}S_{0.10}$, and $Fe_{0.76}Cr_{0.24}$ layers is approximately 0.5 μm thick, forming two structures approximately 1.5 μm thick on the opposite surfaces of the substrate with the two FeCr layers being outermost.

The elements Bi, Ag, O and N by are then added to the layers by an electrolysis process that employs a heated electrolyte containing $Bi_2O_3$ and $AgNO_3$. The electrolyte is prepared by heating high purity water to 97° C. in a stainless steel container with a stirring device on the bottom of the container. The $Bi_2O_3$ and $AgNO_3$ powders are then added to the heated water to form the electrolyte. Preferably the proportion of weight of the added powders is about 40% of $Bi_2O_3$ and 60% of $AgNO_3$. The amounts of these powders can be adjusted to achieve a desired current in the electrolyte. After adding the powders, the electrolyte is maintained at 97° C. and stirred continuously for at least one hour to form a uniform solution.

Prior to the electrolysis process, all the metal strips on both sides of the substrate are connected to form a single electrode. The substrate is then immersed in the electrolyte which is maintained at a temperature of 97° C. and is continuously stirred. Advantageously, many substrates can be simultaneously immersed in the electrolysis solution. For example, 100 1 cm×1 cm substrates can be processed simultaneously. In this case the metal strips of all the substrates should be connected to a single electrode.

The complete electrolysis process takes 45 days. Each day the same process cycle is repeated. During the initial 10 hours of the cycle, an electrical potential of +60V is applied to the substrates and during the next 14 hours, a −60V potential is applied to the substrates. The stainless steel container is always kept at ground potential. Also, every 12 hours during the electrolysis process, the positions of the substrates within the container are interchanged for uniform processing. Throughout the process the electrolyte is continuously stirred.

Figure 12B:
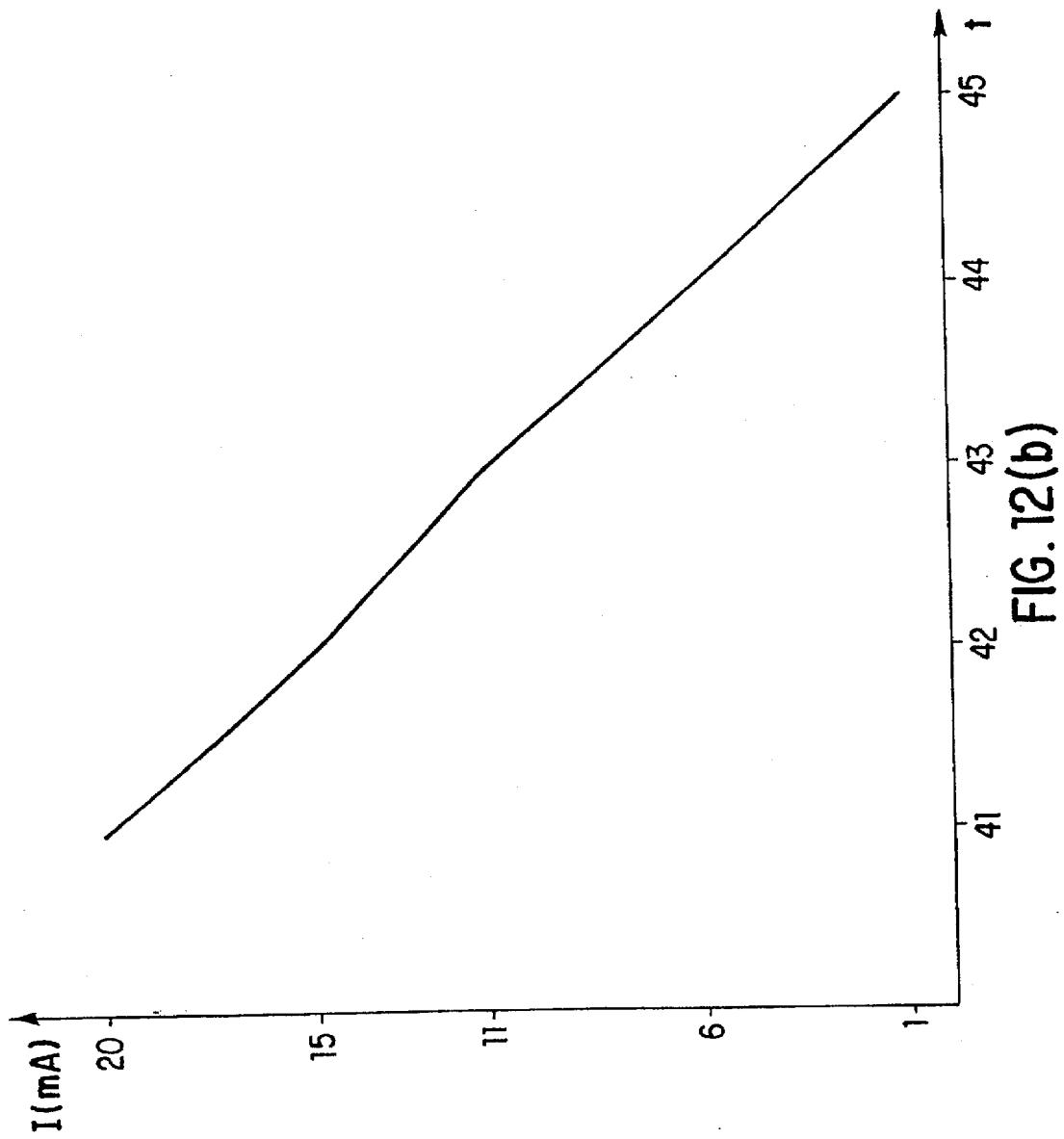

During the process, the amplitude of the current flow in the electrolyte solution is monitored. FIG. 12(a) illustrates the current I in Amperes in the electrolyte during the first forty days of the process. The days are indicated on the horizontal axis "t". FIG. 12(b) illustrates the values of the current I during the last five days. The current I is in mA's.

At the end of the forty-fifth day, the electrode is disconnected from the substrates and the substrates are removed from the electrolyte solution. At this point, the ions of the elements listed above have sufficiently penetrated the layered structure. Note that in a different embodiment ion implantation techniques can be employed for introducing these elements into the layered structure.

The composition of materials on both surfaces of the substrate is then polished until the surfaces are substantially smooth. Subsequently, an approximately 1 μm thick layer of silver is deposited on the surfaces of each substrate to form the electrodes 300, 360.

At the completion of this procedure, a novel two-dimensional memory array has been manufactured. The area near each intersection of the orthogonal address lines 320, 340 constitutes a cell of the memory.

Figure 5B:
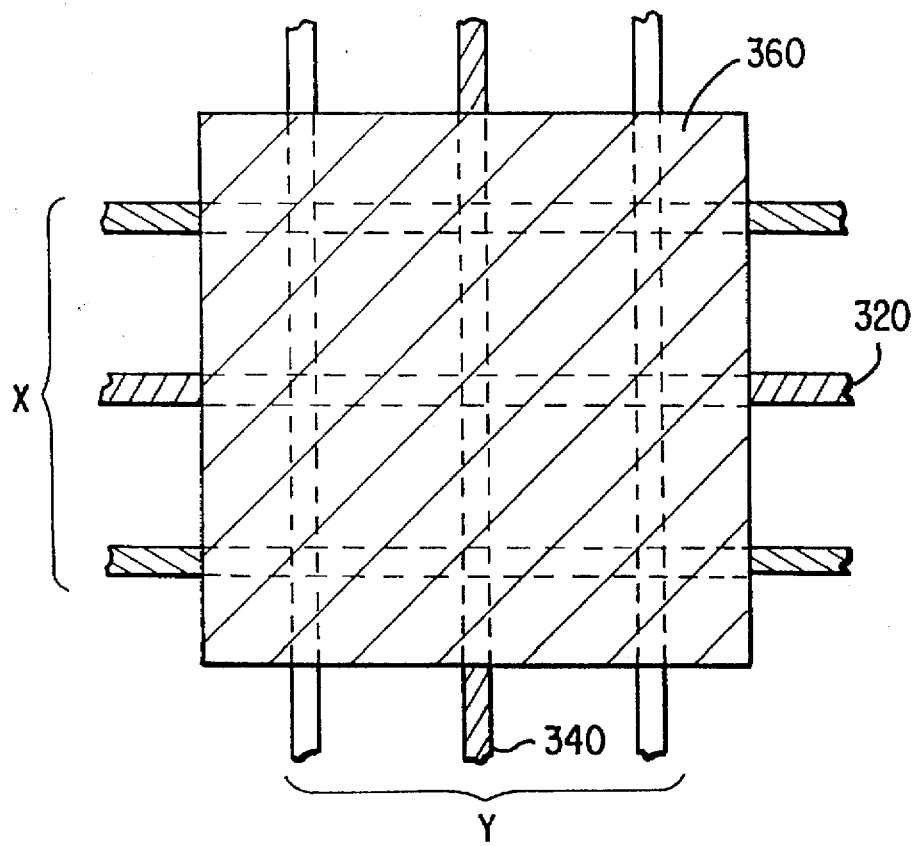

More specifically, as shown in FIGS. 5(a) and 5(b), the set of metal strips on the lower surface of the Si substrate forms a first set of addressing lines, (referred to as X lines), and the set of metal strips on the upper surface of the substrate forms a second set of addressing lines, (referred to as Y lines). When two electrical currents $I_i$ and $I_j$ are simultaneously applied to a given line $X_i$ of the X lines and a line $Y_j$ of the Y lines, respectively, a memory device (i,j) at the intersection of $X_i$ and $Y_j$ is selected. By properly choosing the magnitudes and polarities of the currents $I_i$ and $I_j$, information can be stored or retrieved from the memory device (i,j). Thus, the memory array, comprising the memory devices of the present invention, is random accessible.

The process of storing information in a cell will be apparent from FIGS. 6(a), 6(b), 7(c), 7(b), 8(a), 8(b), 9(a) and 9(b), 10 and 11. FIGS. 6(a) and (b), show top views of a single cell of the memory device.

The orthogonal address lines 325, 345 divide the cell into four quarters 370, 375, 380 and 385, as illustrated in FIG. 6(a). As discussed below, a first bit of information is magnetically stored in the quarters 370 and 380 and a second bit is magnetically stored in the quarters 375 and 385. For simplicity, the quarters 370 and 380, where a first bit of information is stored, are collectively referred to as carrier "a" and the quarters 375 and 385 where a second bit is stored are collectively referred to as a carrier "b".

To store a bit of information in one of the carriers of the memory device, two electrical currents having specified amplitudes and polarities are applied to the first and second address lines, 325, 345. Information is retrieved from one of the carriers by applying two electrical currents to the address lines and measuring a piezoelectric voltage generated between the upper and lower electrodes.

The current applied to the first address line is represented as $I_i$, and the current applied to the second address line is represented as $I_j$. The directions of $I_i$ and $I_j$ are indicated by the arrows entering the address lines. In the preferred embodiment, the currents $I_i$ and $I_j$ have the same amplitude, $I_0$. Each current generates an induced circular magnetic field around the address lines as illustrated by the arrows 390 and 395.

The directions of the magnetic fields $B_i$ and $B_j$ induced by $I_i$ and $I_j$ in each quarter is illustrated in FIGS. 6(a) and (b).

A dot (.) indicates that the field is in the "up" direction and a cross (x) indicates that the field is in the opposite or "down" direction.

As illustrated in FIG. 6(a), in the quarters 485 and 475 (carrier "b") $B_i$ and $B_j$ have the opposite directions and thus cancel each other out. For this reason the currents illustrated in FIG. 6(a) do not affect the information stored in the carrier "b". On the other hand, in the quarters 470 and 480 (carrier "a") the fields $B_i$ and $B_j$ are induced in the same direction. Accordingly, these fields enhance each other and, thus, can alter the stored information.

Thus two currents having the same polarities and amplitudes applied to the address lines, affect only the magnetic state of the carrier "a" and thereby select this carrier, likewise, two negative pulses also select and can store data in the carrier "a". Note also that the amplitudes of the currents that select the carrier "a" do not have to be equal, as long as their combined effect does not change the magnetic state in the carrier "b".

Figure 6B:
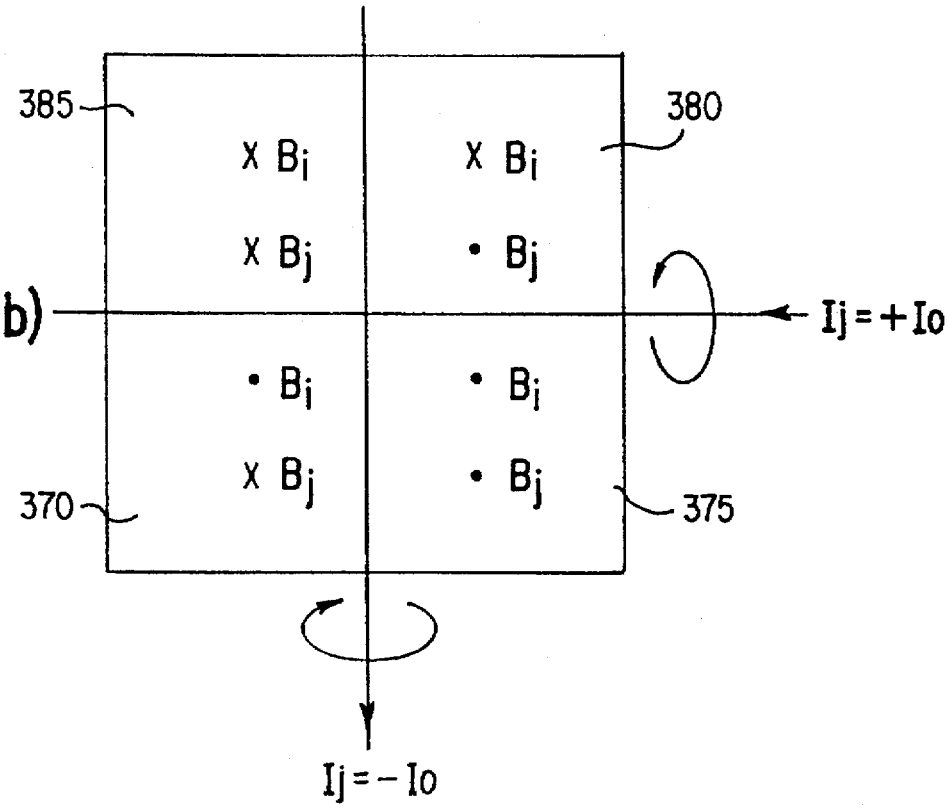

FIG. 6(b) illustrates the process of selecting the carrier "b". Two currents, having opposite polarities, $I_i=+I_0$ and $I_j=-I_0$, are applied to the first and second address lines respectively. As illustrated using the dot and cross convention described above, in the carrier "a", the fields generated by these currents cancel each other out, without affecting the magnetic state. In carrier "b" however the fields generated by these currents enhance each other so that the carrier "b" is selected.

similarly, two currents $I_i=-I_0$ and $I_j=+I_0$ applied to the two address lines also select the carrier "b". Thus two currents with the same amplitude but the opposite polarities select the carrier "b" for storing or retrieving information.

To store information, the amplitudes of the two currents combined should be sufficiently large to switch the magnetization of a carrier between the magnetic states $B_0$ and $-B_0$. In addition, the amplitudes of the two currents combined should be sufficiently small so that a single current alone is unable to change the magnetic state of a carrier. This is necessary to assure that only one carrier in the memory array is selected by the signal on an address line.

To retrieve information, the amplitudes of the two currents combined should be small enough that the induced field is not strong enough to change the magnetic state of the carrier. The combined amplitudes, however, should be sufficient to disturb the magnetic state of the carrier so as to generate a piezoelectric voltage across the storage media. As discussed above, the direction of this piezoelectric voltage represents the binary data stored in the carrier.

By way of illustration, FIG. 7(a) depicts the process of writing a binary "1" into the carrier "a" using synchronous current pulses on the two address lines. Initially, all the cells of the array are assumed to be in the "0" state which corresponds to a magnetic induction of $-B_0$. To write a binary "1", two synchronized current pulses, $I_i=+20$ μA and $I_j=+20$ μA are applied to the two address lines, respectively. This generates a magnetic field H which magnetizes the FeCr layers of the composite material. The magnetic induction $B_r$ of these layers is depicted in FIG. 7(a) as a closed loop with an arrow. For the structure of FIG. 5 having the dimensions described above, the amplitude of the critical current $I_c$ necessary to generate the critical field strength $H_c$ required for switching between the two discrete states is approximately 35 μA. At the cell where the two pulses coincide, the two +20 μA currents create a field H that would be generated by applying a 40 μA current. Since this current is greater than $I_c$, the magnetic induction becomes $B_0$ so that a binary "1" is stored. As explained previously, after the pulses have ended, the magnetic induction at the cell $B_r$ remains equal to $B_0$, so that a binary "1" is retained in the carrier "a".

Figure 7B:
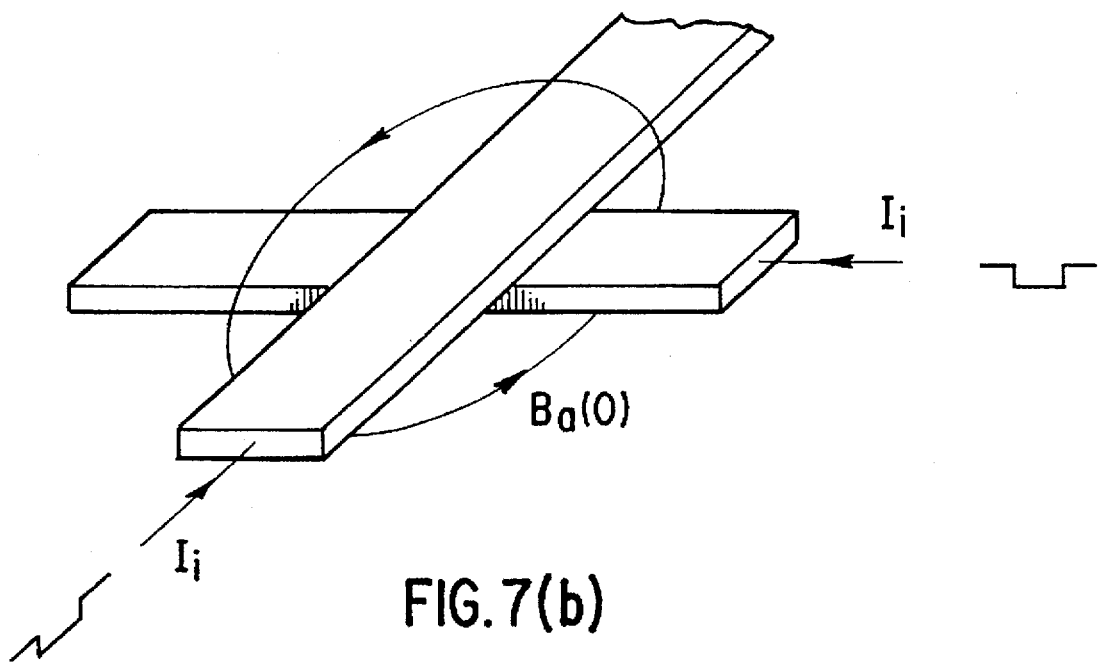

As shown in FIG. 7(b), to store a binary "0" into the carrier "a", two synchronized current pulses, $I_i = -20$ μA and $I_j = -20$ μA are applied to the address lines respectively. Since the sum of these currents is $-40$ μA, which is less than $-I_c$, the current pulses switch the magnetic state from $-B_0$ to $-B_0$.

Switching between $+B_0$ and $-B_0$ generates a piezoelectric voltage pulse between the first and second electrodes after a delay $\Delta t$ from the time of the application of the current pulses. The piezoelectric pulse is positive for switching from $+B_0$ to $-B_0$ and is negative for switching from $-B_0$ to $+B_0$. If the magnetic state does not change, no piezoelectric pulse is generated. Accordingly, the generated piezoelectric voltage pulses can be employed to verify that a bit of binary data has been stored.

To read information stored in the carrier "a" of the memory, two synchronized current pulses $I_i = -15$ μA and $I_j = -15$ μA are applied to the address lines. Since the critical current $I_c = -35$ μA, the $-30$ μA sum of these currents cannot switch the magnetic states from $=B_0$ to $-B_0$. This current, however, is sufficient to disturb the magnetic state without complete switching. As shown in FIG. 8(a), assuming a binary "1" is stored in the carrier, the applied current pulses change $B_r$ from a value corresponding to a point such as "a" on the magnetization curve to the value corresponding to point "b" on the curve. Because of the previously discussed piezoelectric properties of the cell, this change in the magnetic induction generates a positive piezoelectric voltage of approximately +15 μV, indicating a "1" is stored in the carrier.

If a "0" is stored in the carrier "a", the applied current pulses will change $B_a$ from a value corresponding to point "c" to the value corresponding to point "d" on the curve. In this case, however, the magnetic induction of carrier "a" remains at $B_a = -B_0$, so that no piezoelectric voltage is generated, indicating a "0" is stored. The information stored in the device is not changed during the reading process because I is less than $I_c$.

Figure 8B:
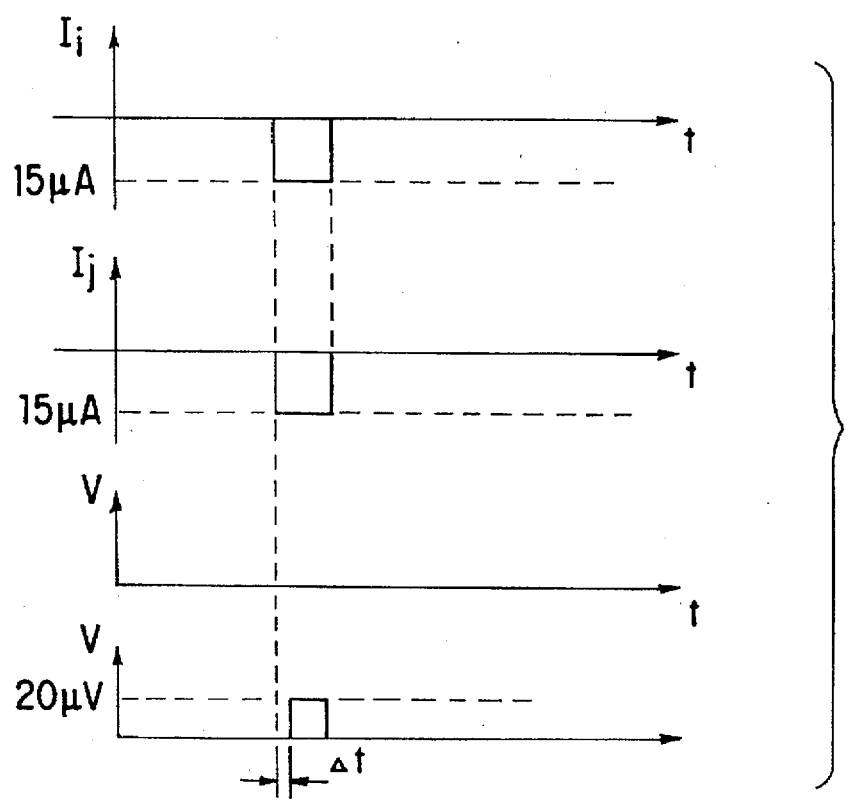

This process of retrieving data is illustrated in the time domain in FIG. 8(b). The delay between the piezoelectric voltage pulse and the synchronized current pulses is approximately 0.75 ns.

The storage and retrieving of data for carrier "b" is similar. As shown in FIG. 9(a), two synchronized current pulses, $I_i = -20$ μA and $I_j = +20$ μA are applied to the address line to store a "1" in the carrier "b". As discussed above, such current pulses do not affect the carrier "a". At the point where the pulses coincide, a field is induced that is equivalent to the field induced by the 40 μA current. Since this is greater than $I_c = 35$ μA, a "1" is stored in the carrier "b". As shown in FIG. 10(b), the current pulses $I_i = +20$ μA and $I_j = -20$ μA are applied to store a "0" in the carrier "b".

Switching from "1" to "0" in the carrier B generates a negative piezoelectric voltage pulse between the electrodes at a delayed time $\Delta t$, and switching from "0" to "1" generates a positive piezoelectric voltage pulse. If the state does not change, no piezoelectric voltage is generated.

The data stored in the carrier "b" is retrieved in a similar way as discussed in conjunction with carrier "a". As shown in FIG. 10, to retrieve data stored in the carrier B, two synchronized current pulses, $I_i = +15$ μA and $I_j = -15$ μA are applied. The combined magnitudes of these pulses are not large enough to switch the magnetic state in carrier "b". If a "0" is stored, the current pulses would not change the magnetic induction $B_b$ of carrier "b" and no piezoelectric voltage between the electrodes is generated. If a "1" is stored, the applied current pulses would disturb the magnetic state $B_b = B_0$, but would not change it, generating a positive piezoelectric voltage pulse at a delay $\Delta t$. Thus, for the carrier "b", no piezoelectric voltage pulse indicates that a "0" is stored, and a positive piezoelectric voltage indicates that a "1" is stored.

FIG. 11 summarizes the above-described methods of storing and retrieving data from the carriers "a" and "b" of the memory device.

Different methods of storing and retrieving information from the memory device of this invention can also be employed. For example, two synchronized currents $I_i = +15$ μA and $I_j = +15$ μ can be utilized for retrieving information from the carrier "a". Similarly, two synchronized currents $I_i = -15$ μA and $I_j = +15$ μA can be used to retrieve data from the carrier "b". A method of destructive readout can also be employed. For example, two synchronized current pulses $I_i = +20$ μA and $I_j = +20$ μA, that write a "1" in the carrier "a", can be applied and the piezoelectric voltage generated in response to these pulses would identify the previously stored data, thereby destructively retrieving data from the carrier A.

One of the advantages of the memory device of the present invention is its low power consumption as compared with the prior art non-volatile magnetic memory devices. Since the storage media employed in this device is highly sensitive to the magnetic field generated by the driving currents, it can quickly switch between "0" and "1" at relatively small driving currents, about 20 μA on each line. Consequently, the power consumption is low for storing and retrieving data in one embodiment, it consumes approximately $3.4 \times 10^{-10}$ w for reading and $6 \times 10^{-10}$ w for storing a bit of data into the device.

Note also that the retrieval of information as a piezoelectric voltage generated between the sensing electrode is intrinsically faster than generating induced electromagnetic voltage as in prior art magnetic memory devices.

Typically, the delay between the current pulses and corresponding piezoelectric voltage is in the range of subnanoseconds. Switching between "1" and "0" usually takes a few nanoseconds.

Thus a memory device which is random accessible, non-volatile, and operates in static mode has been described. This memory device offers high-speed operation, low power consumption, and can store information at high density.

The claims which follow are to be interpreted to cover all the equivalent structures and methods. The invention is, thus, not to be limited by the above exemplary disclosure, but only by the following claims.

What is claim:

1. A non-volatile, random-accessible, memory device comprising:

a substrate having first and second surfaces;

a first address line formed on the first surface of the substrate;

a second address line formed on the second surface of the substrate;

a first composition of materials having ferromagnetic and piezoelectric properties formed on the first address line and the first surface of the substrate; and a second composition of materials having ferromagnetic and piezoelectric properties formed on the second address line and the second surface.

2. The device of claim 1 wherein the second address line is substantially orthogonal to the first address line.

3. The device of claim 1 further comprising:
a first electrode formed on the first composition of materials; and
a second electrode formed on the second composition of materials.

4. The device of claim 1 wherein the first and second compositions of materials are substantially identical.

5. The device of claim 4 wherein each of the first and second compositions of materials comprise three sequentially formed layers wherein the outermost layers have ferromagnetic properties.

6. The device of claim 5 wherein each of the first and second compositions of materials comprise a layer of $Se_{(1-z)}S_z$ interposed between a layer of $M_{(1-x-y)}Cd_xR_y$ where M is an element selected from the group consisting of Pb, Zn, and Te, and R is an element selected from the group consisting of Si and Ge, and a layer of $Fe_{(1-w)}Cr_w$, wherein x, y, z and w are values within the ranges of $0 \leq x \leq 1$, $0 \leq y \leq 1$, $0 \leq (x+y) \leq 1$, $0 \leq z \leq 1$, and $0 \leq w \leq 1$.

7. The device of claim 6 wherein each of the layers of $Pb_{(1-x-y)}Cd_xSi_y$, $Se_{(1-z)}S_z$, and $Fe_{(1-w)}Cr_w$ includes at least one of the following elements: Bi, O, N and an element selected from the group consisting of Ag, Au, Pt, and Cu.

8. The device of claim 7 wherein x, y, z and w are values within the ranges of $0.09 \leq x \leq 0.11$, $0.09 \leq y \leq 0.11$, $0.09 \leq z \leq 0.11$, and $0.18 \leq w \leq 0.30$.

9. The device of claim 8 wherein w is a value within the range of $0.22 \leq w \leq 0.26$.

10. The device of claim 8 wherein the value of x is substantially 0.10, the value of y is substantially 0.10, the value of z is substantially 0.10, and the value of w is substantially 0.24.

11. The device of claim 5 wherein the substrate is an insulator.

12. The device of claim 5 wherein the substrate is a silicon substrate.

13. The device of claim 5 wherein the substrate is a $BaF_2$ substrate.

14. The device of claim 5 wherein the first and second address lines are made of a conductive material.

15. The device of claim 14 wherein the conductive material is silver.

16. The device of claim 15 wherein the address lines are metal strips substantially 2 μm wide and substantially 1 μm thick.

* * * * *